US012644929B2

(12) United States Patent
Lee et al.

(10) Patent No.:     US 12,644,929 B2
(45) Date of Patent:         Jun. 2, 2026

(54) JIG FOR MEASURING 3-ELECTRODE VOLTAGE

(71) Applicants: SAMSUNG SDI CO., LTD., Yongin-si (KR); Research & Business Foundation SUNGKYUNKWAN UNIVERSITY, Suwon-si (KR)

(72) Inventors: Seung Joon Lee, Yongin-si (KR); Jea Woan Lee, Yongin-si (KR); Ho Seok Park, Yongin-si (KR); Jun Su Kim, Gyeongsangbuk-do (KR); Yoon Bin Kim, Yongin-si (KR); Yun Sang Joe, Gangseo-gu (KR)

(73) Assignees: SAMSUNG SDI CO., LTD., Yongin-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 203 days.

(21) Appl. No.: 18/667,091

(22) Filed: May 17, 2024

(65) Prior Publication Data

US 2024/0385247 A1      Nov. 21, 2024

(30) Foreign Application Priority Data

May 19, 2023    (KR) ........................ 10-2023-0064807

(51) Int. Cl.
*G01R 31/36*          (2020.01)
*G01R 31/385*        (2019.01)
(52) U.S. Cl.
CPC ....... *G01R 31/3644* (2013.01); *G01R 31/385* (2019.01)
(58) Field of Classification Search
CPC .......................... G01R 31/385; G01R 31/3644
See application file for complete search history.

(56) References Cited

U.S. PATENT DOCUMENTS

2016/0233537 A1*   8/2016   Suemori ............ H01M 8/2465
2021/0066742 A1     3/2021   Im
(Continued)

FOREIGN PATENT DOCUMENTS

KR      2013-0128030 A     11/2013
KR      2021-0059529 A      5/2021

OTHER PUBLICATIONS

Oct. 8, 2024 Extended Search Report in European Patent Application Pub. No. 24 17 6550.2.

*Primary Examiner* — Alesa Allgood
(74) *Attorney, Agent, or Firm* — Venable LLP

(57)                ABSTRACT

The present disclosure relates to a jig for measuring a 3-electrode voltage. The jig can measure charging and discharging voltages of a secondary battery in an environment similar to that of an actually used secondary battery by minimizing air contact and electrolyte use of a battery cell. In an embodiment, disclosed is a jig for measuring a 3-electrode voltage that comprises a jig body including a receiving part for mounting a secondary battery in which an electrode assembly is accommodated inside a case. The jig also includes a jig door that opens or closes a side of the jig body in which the receiving part is located. The jig further includes a cathode electrode that is mounted to the jig body, with the cathode electrode including a part being electrically connected to a cathode electrode tab protruding from upper portion of the secondary battery mounted in the receiving part, and with a part of the cathode electrode protruding to outside of the jig. An anode electrode is mounted to the jig body, with the cathode electrode being electrically connected to a conductive member electrically connected to the case of the secondary battery, and the cathode electrode having a part protruding to outside of the jig. A reference electrode penetrates a top plate of the jig body, is inserted (Continued)

into an electrolyte in a core of the secondary battery mounted in the receiving part, and protrudes upward from the jig body.

18 Claims, 8 Drawing Sheets

(56) References Cited

U.S. PATENT DOCUMENTS

| | | | |
|---|---|---|---|
| 2022/0357401 A1 | 11/2022 | Ji et al. | |
| 2023/0307678 A1* | 9/2023 | Sato | H01M 8/04514 |

\* cited by examiner

| Comparison condition | Actual secondary battery | Inventive jig (200) |
|---|---|---|
| Average charging/discharging efficiency (%) | 99.7 | 99.6 |
| 20th capacity retention rate (%) | 96.7 | 95.4 |

| Comparison condition | Actual secondary battery | Inventive jig (200) |
|---|---|---|
| Average charging/discharging efficiency (%) | 99.8 | 99.7 |
| 20th capacity retention rate (%) | 97.8 | 96.1 |

JIG FOR MEASURING 3-ELECTRODE VOLTAGE

CROSS-REFERENCE TO RELATED APPLICATION

This application claims priority to and the benefit of Korean Patent Application No. 10-2023-0064807 filed on May 19, 2023, in the Korean Intellectual Property Office, the entire disclosure of which is incorporated herein by reference.

BACKGROUND

1. Field

Various embodiments of the present disclosure relate to a jig for measuring a 3-electrode voltage.

2. Description of the Related Art

Generally, an electrode potential of a battery is measured when developing a new battery cell and confirming performance of the manufactured battery cell. A method of measuring an electrode potential in a three-electrode system composed of a reference electrode, a working electrode, and a potential electrode is mainly used.

The reference electrode is an electrode is for measuring the potential of an electrode forming a battery or an electrode where electrolysis occurs, used in manufacturing a battery circuit for electrode potential measurement in combination, and is used as a potential standard when measuring a relative value of an electrode potential.

The reference electrode should satisfy the requirements such as following the Nernst equilibrium equation as a reversible electrode potential (an electrode in a reversible state), having a nonpolarizing characteristic to maintain a constant potential value at all time, having as little liquid potential difference as possible, having a small potential change even with a temperature change, and representing a constant potential value at a constant temperature.

In this regard, measurements of electrode potentials are often being performed in the field of secondary batteries, which is rapidly growing in recent years, for the development of new batteries and performance improvement of existing batteries. In measuring electrode potentials of such secondary batteries, conventional methods are generally being used. For example, when measuring the performance of a newly developed cathode active material, an electrode potential is measured by placing an electrolyte in a container and installing a cathode coated with the cathode active material as a working electrode, a reference electrode, and an anode as an auxiliary electrode. However, this method has the following problems.

First, results that do not match the electrode potential in an actual cell may be obtained. In general, in a secondary battery, an electrode assembly of a specific structure consisting of a cathode/separator/anode is impregnated with an electrolyte and placed in a sealed case (a can, a pouch, etc.), and various other battery components are installed. Accordingly, the internal environments of an actual secondary battery are quite different from the aforementioned experimental conditions, and, thus, there is a difference when the electrode potential is measured under the very simplified experimental conditions.

Second, the potential changes of the anode and cathode during actual charging and discharging may not be measured simultaneously.

Third, in order to measure the electrode potential, the manufactured battery must be completely disassembled. When periodic tests are conducted for the purpose of quality evaluation of mass-produced batteries, complete disassembly of the battery is time-consuming and causes changes in the actual conditions of the battery as described above, making it difficult to obtain accurate results.

Fourth, it may not be easy to measure the electrode potential while setting various experimental conditions to measure the various physical properties required for the battery. Secondary batteries should satisfy various requirements, such as safety at high temperatures and safety at needle penetration. And under the experimental conditions for confirming whether these requirements are met, electrode potentials should be measured.

Meanwhile, in order to measure electrode potentials in a solution, a potential difference should be measured in an equilibrium state where the actual current between a working electrode and a reference electrode can be almost ignored.

However, when an external voltage is applied between electrodes, a voltage drop may occur due to resistance between the electrodes, causing the reference electrode potential to deviate from the equilibrium state, resulting in a considerable error.

In addition, when evaluating a battery cell to measure an electrode potential of a three-electrode system, the most common methods are to immerse a jelly-roll in a solution in a beaker or to disassemble the jelly-roll into a bi-cell type and then measure the electrode potential.

However, the measurement using a beaker or bi-cell as in the above method has the problem that manufacture is not easy and time consuming.

Therefore, in relation to secondary batteries, existing methods for measuring electrode potentials of a three-electrode system have many problems, and, thus, there is currently a high need for techniques that can solve these problems.

SUMMARY

The present disclosure provides a jig for measuring a 3-electrode voltage, which can measure charging and discharging voltages of a secondary battery in an environment similar to that of an actually used secondary battery by minimizing air contact and electrolyte use of a battery cell.

In addition, the present disclosure provides a jig for measuring a 3-electrode voltage, which can measure charging and discharging voltages of a secondary battery in an environment similar to that of an actually used secondary battery, and, thus, reduce errors in evaluating the secondary battery.

A jig for measuring a 3-electrode voltage according to an embodiment of the present disclosure may include: a jig body including (i) a receiving part configured to mount a secondary battery and (ii) a top plate; a jig door that opens or closes a side of the jig body at which the receiving part is located; a cathode electrode that is mounted on the jig body, with a first part of the cathode electrode being positioned in the receiving part, the first part of the cathode electrode configured to be electrically connected to the secondary battery mounted on the receiving part, and with the cathode electrode having a second part protruding to outside of the jig; an anode electrode that is mounted on the jig body, with a first part of the anode electrode being positioned in the receiving part, the first part of the anode electrode configured to be electrically connected to the secondary battery mounted in the receiving part, and with the anode electrode having a second part protruding to outside of the jig; and a reference electrode that penetrates the top plate, is configured to be inserted into an electrolyte in a core of the secondary battery mounted in the receiving part, and protrudes upward from the jig body.

The reference electrode may have a metal cap put on one end of a metal wire, the metal cap configured to be inserted into a core of the secondary battery.

The top plate of the jig body may include a reference groove having a depth downward from the top surface, and a reference hole penetrating the top plate downward from a center of the reference groove.

A protection tube interposed between the reference electrode and the jig body may be further included, and the protection tube may include (i) a body part having a diameter corresponding to an inner diameter of the reference groove and (ii) an extension part extending downward from a center of the body part, the extension part having a diameter corresponding to the inner diameter of the reference hole.

The protection tube may further include an O-ring provided on an outer surface of the body part.

The protection tube may further include a penetration tube that extends between the upper and lower portions of the protection tube, and the reference electrode extends through the penetration tube, and the reference electrode protrudes upward of and downward from the protection tube.

A hole cover coupled to the top plate of the jig body, the hole cover having a reference hole for exposing a protruding portion of the reference electrode to outside of the jig may be further included.

The hole cover may include a reference groove having a length upward from a bottom surface of the hole cover, and a reference hole penetrating the hole cover upward from a center of the reference groove of the hole cover.

The protection tube may have a body part interposed between the top plate of the jig body and the hole cover.

The jig door may have a flat plate shape, one edge of the inner surface of the jig door may be coupled to the jig body by a hinge, and the side of the jig body may be opened or closed by rotation.

The jig door may further include a receiving part on the inner surface thereof configured to accommodate a portion of the secondary battery mounted within the receiving part of the jig body.

A rubber packing may be further provided along an edge of the inner surface of the jig door, and the rubber packing may be interposed between the inner surface of the jig door and the side of the jig body.

In the jig door, a spring press may be provided on the inner surface, with the spring press being configured to contact the secondary battery.

The jig body may have a rectangular parallelepiped shape.

The inner surface of the receiving part may be configured such that a conductive member of the second battery extends to partially cover the side of the jig body.

The cathode electrode may be mounted on an upper part of the side.

Another embodiment includes the combination of a jig and a secondary battery positioned in the receiving part of the jig.

In a further embodiment, a jig is provided for measuring a 3-electrode voltage of a secondary battery. The jig comprises a jig body including (i) a receiving part configured to receive the secondary battery and (ii) a top plate. A jig door opens or closes a side of the jig body at which the receiving part is located. A cathode electrode is mounted to the jig body, with a first part of the cathode electrode being positioned in the receiving part, and with a second part of the cathode electrode protruding to outside of the jig. An anode electrode is mounted to the jig body, with a first part of the cathode electrode being positioned in the receiving part, and with a second part of the anode electrode protruding to outside of the jig. A reference electrode penetrates the top plate of the jig body and protrudes upward from the jig body.

BRIEF DESCRIPTION OF DRAWINGS

FIGS. 5A and 5B are perspective views showing states before and after removing a cap from a secondary battery for measuring an electrode potential in the jig for measuring the 3-electrode voltage of FIG. 1.

DETAILED DESCRIPTION

Figure 1:
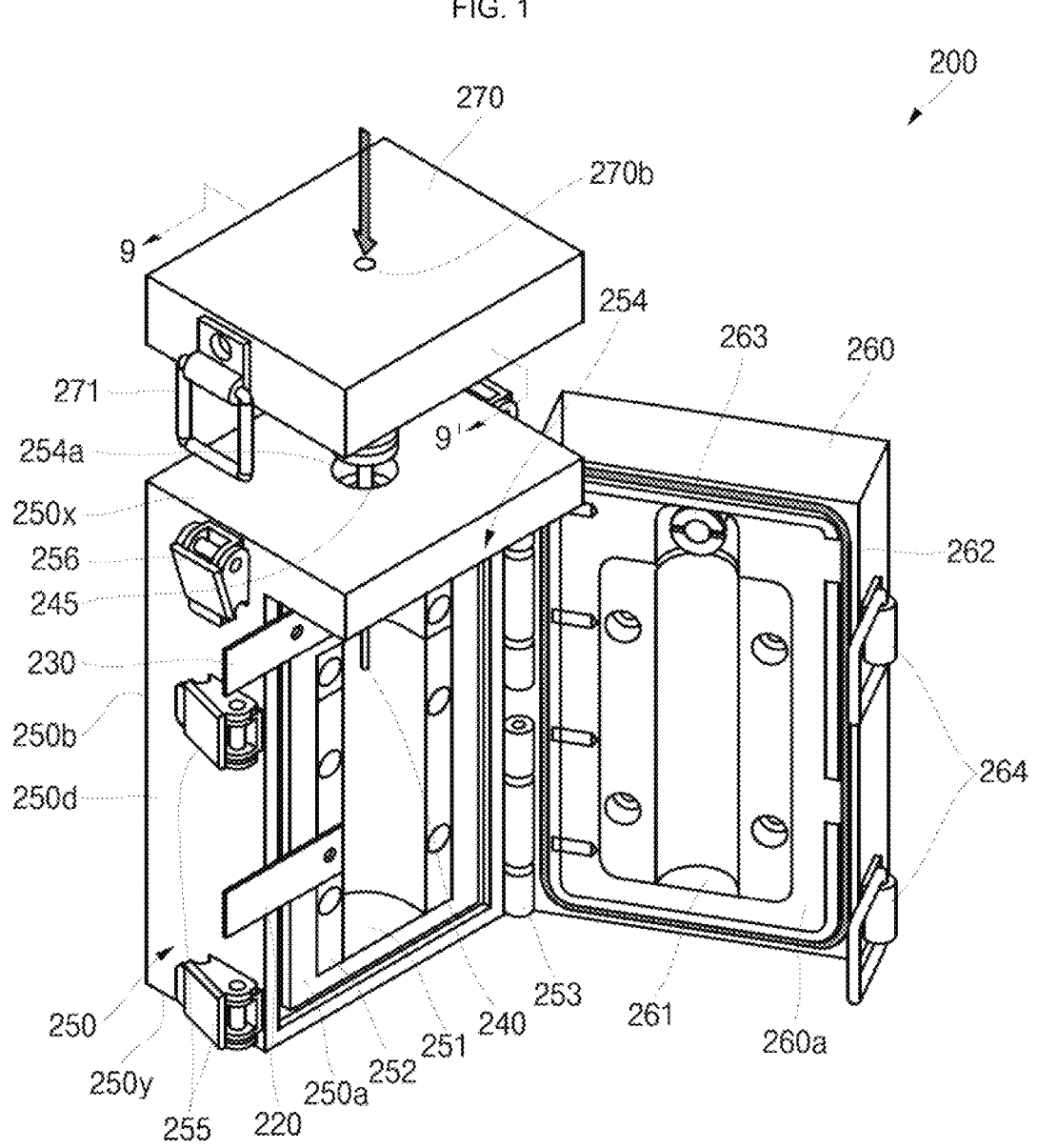
FIG. 1 is a perspective view showing a jig for measuring a 3-electrode voltage according to the present disclosure.

Hereinafter, preferred embodiments of the present disclosure will be described in detail with reference to the accompanying drawings.

Examples of the present disclosure are provided to more completely explain the present disclosure to those skilled in the art, and the following examples may be modified in various other forms. The present disclosure, however, may be embodied in many different forms and should not be construed as being limited to the example (or exemplary) embodiments set forth herein. Rather, these example embodiments are provided so that this disclosure will be thorough and complete and will convey the aspects and features of the present disclosure to those skilled in the art.

In addition, in the accompanying drawings, sizes or thicknesses of various components are exaggerated for brevity and clarity. Like numbers refer to like elements throughout. As used herein, the term "and/or" includes any and all combinations of one or more of the associated listed items.

In addition, it will be understood that when an element A is referred to as being "connected to" an element B, the element A can be directly connected to the element B or an intervening element C may be present therebetween such that the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms that the terms "comprise" and/or "comprising," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the element or feature in the figures is turned over, elements described as "below" or "beneath" other elements or features would then be oriented "on" or "above" the other elements or features. Thus, the exemplary term "below" can encompass both an orientation of above and below.

A preferred embodiment of the present disclosure will now described in detail with reference to the attached drawings so that a person skilled in the technical field to which the present disclosure belongs can easily practice the present disclosure.

Throughout the specification, elements having similar configurations and operations are given the same reference numerals. In addition, when an element is referred to as being electrically coupled another element, this may encompass not only a case where they are directly connected to each other, but also a case where they are connected to each other with another element disposed therebetween.

Figure 2A:
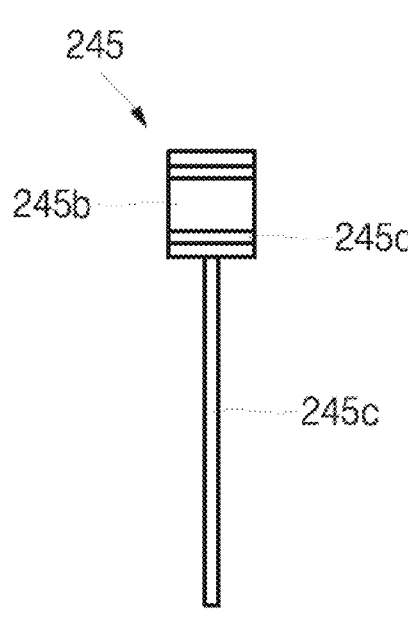
FIGS. 2A and 2B are enlarged front views showing a protection tube in the jig for measuring the 3-electrode voltage of FIG. 1 and the protection tube coupled to a reference electrode.
Figure 2B:
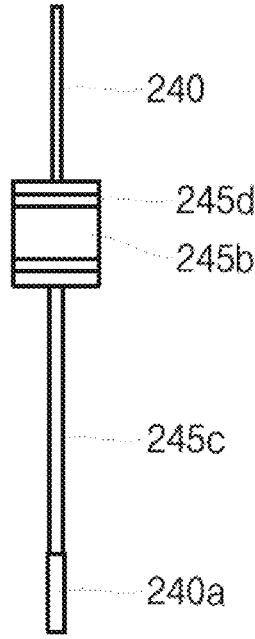
Figures 3, 4:
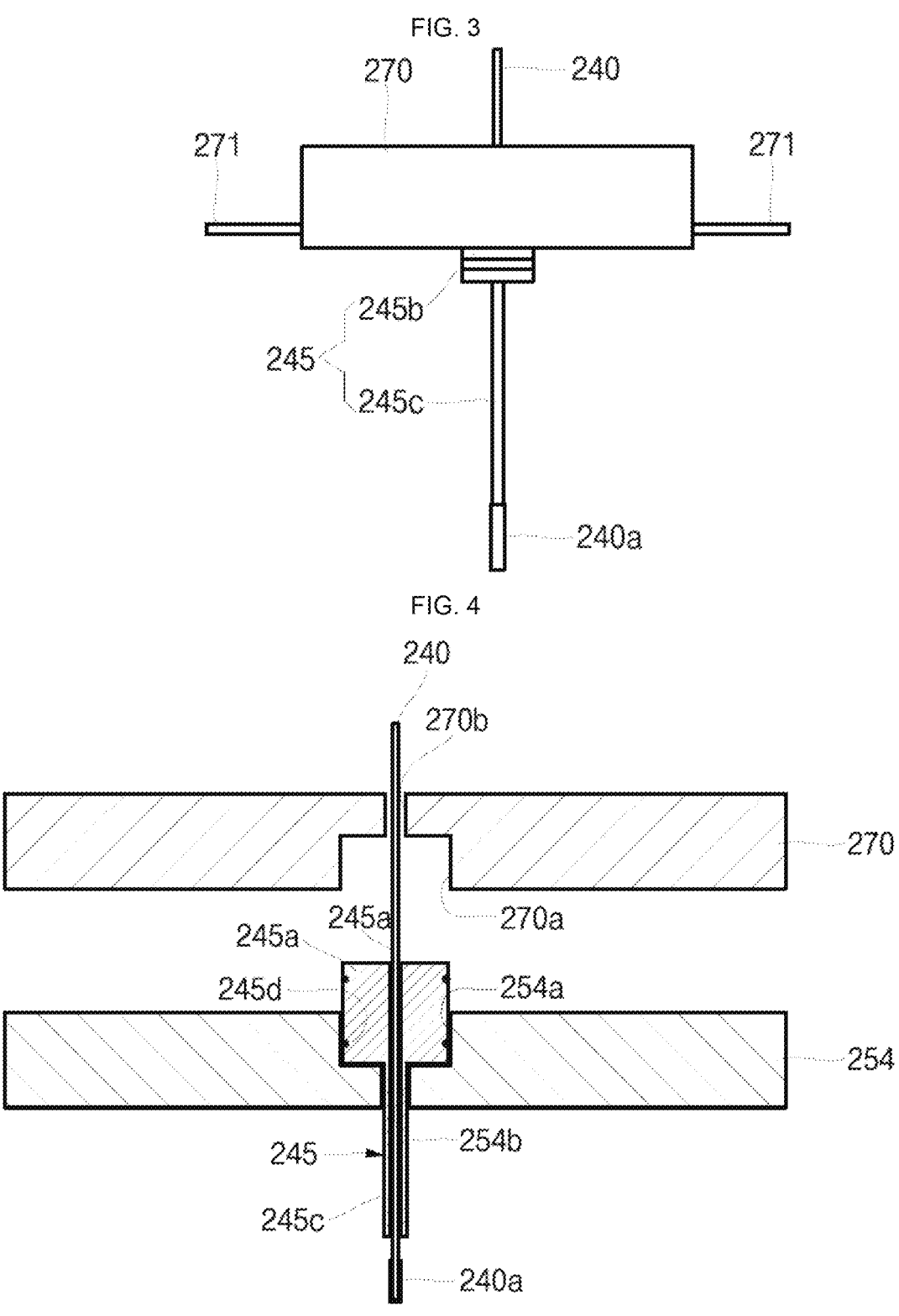
FIG. 3 is a front view showing the configuration in which the protection tube coupled to the reference electrode of FIG. 2B is mounted on a hole cover.
FIG. 4 is a cross-sectional view cut longitudinally of an upper end of FIG. 1, into which the reference electrode is inserted.
Figure 5A:
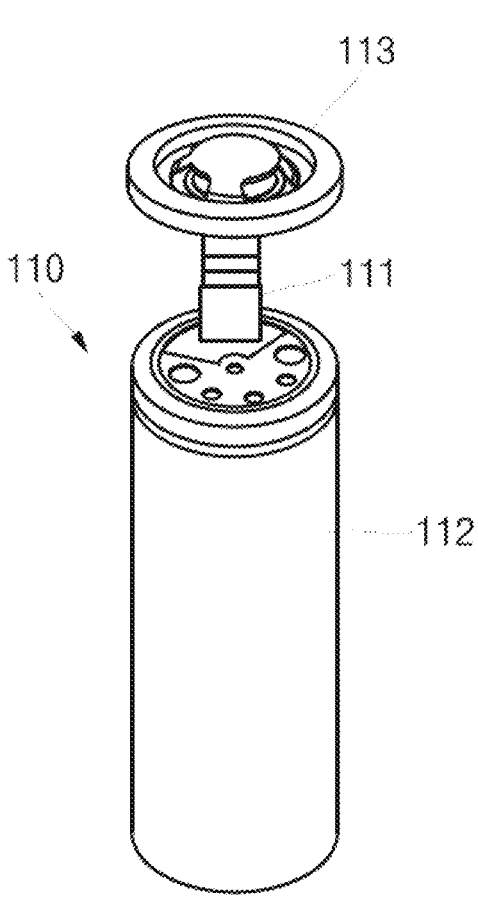
Figure 5B:
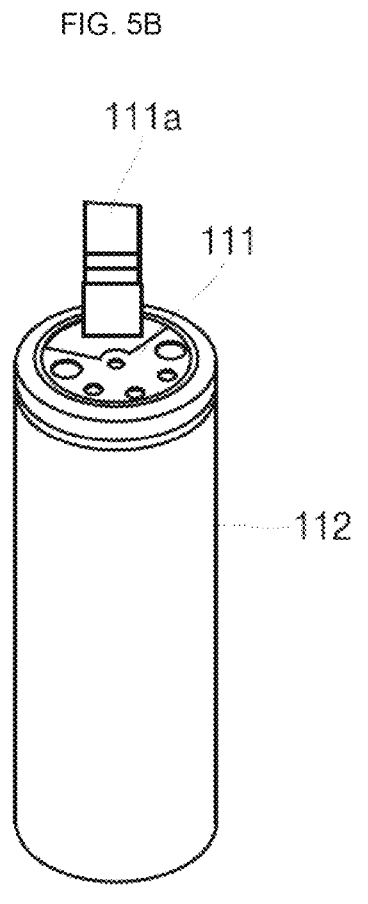

FIG. 1 is a perspective view showing a jig for measuring a 3-electrode voltage according to the present disclosure. FIGS. 2A and 2B are enlarged front views showing a protection tube in the jig for measuring the 3-electrode voltage of FIG. 1 and the protection tube coupled to a reference electrode. FIG. 3 is a front view showing the configuration in which the protection tube coupled to the reference electrode of FIG. 2B is mounted on a hole cover. FIG. 4 is a cross-sectional view cut longitudinally of an upper end of FIG. 1, into which the reference electrode is inserted. FIGS. 5A and 5B are perspective views showing states before and after removing a cap from a secondary battery for measuring an electrode potential in the jig for measuring the 3-electrode voltage of FIG. 1.

Referring to FIGS. 1, 2A, 2B, 3, 4, 5A, and 5B, a jig 200 for measuring a 3-electrode voltage according to the present disclosure will now be described.

The jig 200 for measuring a 3-electrode voltage may include a jig body 250 in which a secondary battery 110 is accommodated, a jig door 260 that seals the jig body 250, an anode electrode 220 and a cathode electrode 230 mounted on the jig body 250, a protection tube 245 and a reference electrode 240 coupled while penetrating the upper side of the jig body 250, and a hole cover 270 coupled to an upper portion of the jig body 250. Here, the secondary battery 110 is a separate from the jig 200 for measuring the 3-electrode voltage and can be mounted on and detached from the jig 200 for measuring a 3-electrode voltage.

The secondary battery 110 may be manufactured by accommodating an electrode assembly 111 having a wound structure in a cylindrical case 112, injecting an electrolyte into the case 112, and then coupling a cap assembly 113 with a cathode terminal to an open top end of the case 112. That is, a positive terminal is installed at the open top of the case 112.

In the present disclosure, in the secondary battery 110 for measuring a 3-electrode voltage, the cap assembly 113 may be removed before the secondary battery 110 is accommodated in a receiving part 251 of the jig 200. That is, secondary battery 110 including the electrode assembly 111 is accommodated in the case 112.

The electrode assembly 111 includes an anode plate coated with anode active material, a cathode plate coated with cathode active material. A separator is interposed between the anode plate and cathode plate to prevent short circuits between the anode plate and the cathode plate and to allow the movement of only lithium ions. The electrode assembly 111 may be formed by winding an anode plate, a separator, a cathode plate, and a separator in a substantially cylindrical shape. The electrode assembly 111 may be wound while the separator extends further in the direction of a winding leading edge compared to the anode plate and the cathode plate. That is, the electrode assembly 111 may have the separator located at a core.

In the electrode assembly 111, a cathode tab 111a electrically connected to the cathode plate may protrude upward, and an anode tab electrically connected to the anode plate may protrude downward. Here, the anode tab may be connected and coupled to the lower portion of the case 112 by welding. Therefore, the case 112 may operate as an anode.

The jig body 250 has a substantially rectangular parallelepiped shape and may include a top side 250x and a bottom side 250y that is opposite to the top side 250x. The jig body 250 may include a first side 250a connected to the jig door 260 and a second side 250b opposite to the first side 250a. In addition, the jig body 250 may also include a first lateral side and a second lateral side 250d connecting the first side 250a and the second side 250b to each other.

The jig body 250 may be made of insulating material. For example, the jig body 250 may be made of polyethylene terephthalate (PET) or an equivalent material. The jig body 250 may include a receiving part 251 for accommodating the cylindrical secondary battery 110 from which the cap assembly 113 has been removed, with the receiving part 251 extending inwardly from the flat first side 250a. The receiving part 251 may have a semi-cylindrical shape corresponding to the lateral side shape of the secondary battery 110. The receiving part 251 may be located approximately at the center of the first side 250a.

The jig body 250 may further include a fixing means 253 for rotating and fixing the jig door 260 at one edge where the first surface 250a and the first side are connected. Here, the fixing means 253 may be a hinge. That is, the jig door 260, which is fixed to one edge of the jig body 250 and may rotate to open or close the first side 250a.

The jig body 250 may further include a conductive member 252 provided to cover the inner surface of the receiving part 251. The conductive member 252 is a metal plate and may be provided in a shape corresponding to the inner surface of the receiving part 251. The conductive member 252 may be further extended in the direction of the other edge where the first side 250a and the second lateral side 250d of the jig body 250 are connected so as to cover a portion of the first side 250a. The conductive member 252 may be electrically connected to the anode electrode 220.

The anode electrode 220 may be a flat metal plate. One surface of the anode electrode 220 may be in contact with the first side 250a of the jig body 250, and the other surface may be exposed to outside of the jig body 250. Of course, when the jig door 260 is combined with the jig body 250, the other side of the anode electrode 220 can be in contact with the inner surface of the jig door 260. The anode electrode 220 may be electrically and mechanically coupled to the conductive member 252, one end of which covers the first side 250a of the jig body 250. The anode electrode 220 may be mounted to extend on the first side 250a of the jig body 250, so that the other end may protrude toward the other edge connected to the second side 250d. The anode electrode 220 and the conductive member 252 may be made of the same metal. For example, the anode electrode 220 and the conductive member 252 may be made of aluminum (AI), copper (Cu), nickel (Ni), gold (Au), platinum (Pt), or an equivalent metal. More preferably, the anode electrode 220 and the conductive member 252 may be made of nickel (Ni) to reduce contact resistance with respect to the nickel (Ni) case 112 of the battery 100.

When the secondary battery 110 is coupled into the receiving part 251 of the jig body 250, the case 112 of the secondary battery 110 and the conductive member 252 may be in contact with and electrically connected to each other. That is, the anode electrode 220 may be electrically connected to the case 112 of the secondary battery 110. Here, the secondary battery 110 may be the same as the secondary battery 110 113 shown in FIG. 5B from which the cap assembly has been removed. The secondary battery 110 may be charged with an electrolyte before being inserted into the receiving part 251.

In addition, the jig body 250 may have the cathode electrode 230 mounted on the upper side of the first side 250a. The cathode electrode 230 may be a flat metal plate. One side of the cathode electrode 230 may be in contact with the first side 250a of the jig body 250, and the other side may be exposed to outside of the jig body 250. Of course, when the jig door 260 is coupled to the jig body 250, the other side of the cathode electrode 230 may be in contact with the inner surface of the jig door 260. One end of the cathode electrode 230 may be fixed to the upper side of the first side 250a of the jig body 250, and the other end may protrude toward the other edge where the first side 250a and the second side 250d of the jig body 250 are connected. The cathode electrode 230 may be approximately parallel to the anode electrode 220. The cathode electrode 230 may be spaced apart from the conductive member 252. The cathode electrode 230 may be made of aluminum (Al), copper (Cu), nickel (Ni), gold (Au), platinum (Pt), or an equivalent metal. More preferably, the cathode electrode 230 may be made of aluminum (Al) to reduce contact resistance with respect to the aluminum (Al) cathode tab 111a made of the secondary battery 110. When the secondary battery 110 is coupled to the receiving part 251 of the jig body 250, the cathode tab 110a of the secondary battery 110 may be in contact with and electrically connected to the cathode electrode 230.

The top side 250x of jig body 250 may protrude further outward than the first side 250a. More preferably, the jig body 250 may further include a flat plate-shaped top plate 254 extending to cover the top side of the jig door 260 when the jig door 260 is coupled to the first side 250a. The top side of the top plate 254 may be the same as the top side 250x of the jig body 250.

The jig body 250 may include a reference groove 254a having a certain depth downward from the top side of the top plate 254. The reference groove 254a may be located approximately at the center of the top plate 254. In addition, the jig body 250 may include a reference hole 254b formed downward from approximately the center of the reference hole 254a and penetrating the top plate 254. The inner diameter of the reference groove 254a may be larger than the inner diameter of the reference hole 254b.

The reference hole 254b may be located at an upper portion of the receiving part 251. The planar shape of the reference groove 254a and the reference hole 254b may be circular. The protection tube 245 may be installed in the reference groove 254a and the reference hole 254b. That is, the protection tube 245 may be mounted in the reference groove 254a and the reference hole 254b of the jig body 250 and may penetrate the top plate 254. The top end of the protection tube 245 may be exposed upward from the top plate 254, and the bottom end of the protection tube 245 may be located within the core of the secondary battery 110 mounted in the receiving part 251. The top end of the protection tube 245 may be larger than the bottom end.

The protection tube 245 may include a cylindrical body part 245b having a constant diameter and a cylindrical extension part 245c extending downward from the center of the bottom side of the body part 245b and having a smaller diameter than the body part 245b. That is, the protection tube 245 may have a stepped outer surface between the body part 245b and the extension part 245c. Here, the diameter of the body part 245b may correspond to the inner diameter of the reference groove 254a, and the diameter of the extension part 254b may correspond to the inner diameter of the reference hole 254b. Of course, the diameter of the protection tube 245 may be smaller than the inner diameter of the reference groove 254a and the reference hole 254b, thereby facilitating mounting of the protection tube 245 on the jig body 250. In addition, an O-ring 245d may be further provided on the outer surface of the body part 245b of the protection tube 245. By including the O-ring 245d, there is improved sealing between the protection tube 245 and the reference groove 254a. The protection tube 245 may include one or more O-rings 245d on the body part 245b, but is not so limited in the present disclosure.

In addition, the protection tube 245 may include a penetration tube 245a that between the upper and lower portions of the penetration tube 245. The reference electrode 240 may be inserted into the receiving part 251 of the jig body 250 through the penetration tube 245a of the protection tube 245. That is, the reference electrode 240 may be inserted into the electrolyte in the core of the secondary battery 110 when the secondary battery 110 is mounted in the receiving part 251 of the jig body 250. Here, the protection tube 245 may facilitate insertion of the reference electrode 240 into the reference hole 254b provided in the jig body 250. In addition, the protection tube 245 may be coupled and fixed to the top plate 254 of the jig body 250 by means of the body part 245b of the protection tube 245. The protection tube 245 may be made of an insulating material. Preferably, the protection tube 245 may be made of polyether ether ketone (PEEK) or an equivalent material.

Figure 6:
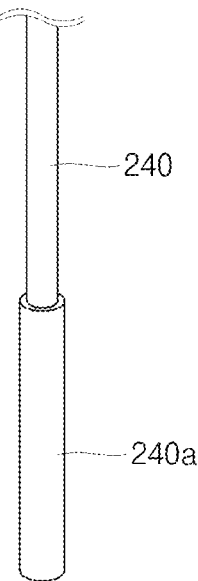
FIG. 6 is an enlarged view showing one end of the reference electrode of FIG. 1.

As shown in FIG. 6, the reference electrode 240 may have a shape in which a metal cap 240a is put on one end of a metal wire. Here, the reference electrode 240 may be made of copper. In addition, the metal cap 240*a* of the reference electrode 240 may be made of lithium. That is, the reference electrode 240 may have lithium put on one end of a copper wire. One end of the reference electrode 240 may be inserted into the core of the electrode assembly 111 through the penetration tube 245*a* of the protection tube 245. Since a separator is located within the core of the electrode assembly 111 of the secondary battery 110, the reference electrode 240 may not be in electrical contact with the electrode assembly 111. The reference electrode 240 may protrude upward from the protection tube 245, and the metal cap 240*a* may protrude downward. The bottom end of the reference electrode 240 may be located inside the receiving part 251 of the jig body 250.

The jig body 250 may further include a coupling means 255 for coupling and fixing the jig door 260 on the second side 250*b*. The coupling means 255 may be, for example, latch parts that correspond to coupling means/latch parts 264 in the jig door 260. Although the jig body 250 including two coupling means 255 is shown in FIG. 1, the number of coupling means 255 can be changed into one or more as convenient.

The jig door 260 has a flat plate shape, and one edge thereof may be coupled to the jig body 250 by means of the fixing means 253. The jig door 260 may further include a fixing means/latch parts 264 mounted on the other edge. The jig door 260 may be rotated by the fixing means 253, and the first side 250*a* of the jig body 250 may be opened or closed.

The jig door 260 may include a flat inner surface 260*a* and an opposite outer surface. The inner surface 260*a* of the jig door 260 may contact or be close to the first side 250*a* of the jig body 250. The inner surface 260*a* of the jig door 260 may be provided with a receiving part 261 for accommodating a part of the secondary battery 110 mounted within the receiving part 251 of the jig body 250. The receiving part 261 of the jig door 260 may be shaped to correspond to the receiving part 251 of the jig body 250. That is, when the inner surface 260*a* of the jig door 260 is coupled to the first side 250*a* of the jig body 250, a portion of the secondary battery 110 mounted within the receiving part 251 of the jig body 250 is positioned in the receiving part 261 of the jig door 260. Here, the receiving part 261 of the jig door 260 may have a semi-cylindrical shape corresponding to the shape of the secondary battery 110.

The jig door 260 may further include a rubber packing 262 along the edge of the inner surface 260*a*. When the inner surface 260*a* of the jig door 260 is coupled to the first side 250*a* of the jig body 250, the rubber packing 262 may be interposed therebetween, thereby improving the sealing of the receiving parts 251 and 262. In addition, the jig door 260 may further include a spring press 263 on the inner surface 260*a* that is in contact with the cathode electrode 130 and the cathode tab 110*a* of the secondary battery 110. Here, the spring press 263 may pressurize the cathode tab 110*a* of the secondary battery 110 to facilitate contact with the cathode electrode 130. That is, the contact resistance between the cathode tab 110*a* and the cathode electrode 230 of the secondary battery 110 can be reduced by means of the spring press 263, and electrical connection can be facilitated.

In addition, the jig door 260 may include the coupling means 264 at a corresponding position to be coupled and fixed to the coupling means 255 of the jig body 250. One edge of the jig door 260 may be coupled to the jig body 250 by a fixing means 253, and the coupling means 264 may be mounted on a lateral side adjacent to the other edge. Preferably, the coupling means 255 of the jig body 250 and the coupling means 264 of the jig door 260 may be mounted so as to be spaced apart from the anode electrode 220 and the cathode electrode 230. Here, by coupling the coupling means 264 of the jig door 260 and the coupling means 255 of the jig body 250, a space between the jig body 250 and the jig door 260 can be sealed. That is, when the jig body 250 and the jig door 260 are coupled to each other, the secondary battery 110 can be located within the sealed receiving parts 251 and 261.

The anode electrode 220 and the cathode electrode 230 may be exposed to the other side between the jig body 250 and the jig door 260 and protrude to outside of the jig 200. In addition, the reference electrode 240 may be exposed to the top plate 254 of the jig body 250 and protrude to outside of the jig 200.

In addition, the hole cover 270 may be coupled to an upper portion of the top plate 254 of the jig body 250. The hole cover 270 has an approximately square plate shape and may be sized to correspond to the top plate 254 of the jig body 250. In addition, a reference groove 270*a* may be provided on the bottom side of the hole cover 270 and extend a certain length upward from the bottom side. In addition, the hole cover 270 may further include a reference hole 270*b* penetrating the hole cover 270 at approximately the center of the reference groove 270*a*. The reference groove 270*a* and the reference hole 270*b* of the hole cover 270 may be shaped to be symmetrical to the reference groove 254*a* and the reference hole 254*b* of the jig body 250. The inner diameters of the reference groove 270*a* and the reference hole 270*b* of the hole cover 270 may correspond to those of the reference groove 254*a* and the reference hole 254*b* of the jig body 250.

A body part 245*b* of the protection tube 245 may be inserted into the reference groove 270*a* of the hole cover 270 and the reference groove 254*a* of the jig body 250. The reference electrode 240 may extend upward from the protection tube 245 through the reference hole 270*b* protrude upward from the hole cover 270.

The hole cover 270 may be coupled to the jig body 250 by a coupling means 271 (e.g., latch part). Here, the coupling means 271 (e.g., a latch part) may be mounted on the lateral side of the hole cover 270 so as to be symmetrical to each other. Of course, the jig body 250 may also be provided with a coupling means 256 (e.g., latch part) at a position corresponding to the hole cover 270. That is, the hole cover 270 may be coupled to the jig body 250 by the coupling means 256 and 271, and thus the protection tube 245 can be fixed to the jig body 250.

Referring to Table 1, the results of measuring values of a charging time to reach a certain voltage in each of an actual secondary battery and the secondary battery mounted in the jig 200 for measuring a 3-electrode voltage (as shown in FIG. 1) and average values thereof, are shown. Here, the actual secondary battery and the secondary battery mounted in the jig 200 for measuring a 3-electrode voltage are secondary batteries the same capacity manufactured through the same manufacturing process. In the jig 200 for measuring a 3-electrode voltage, the anode electrode 220, the cathode electrode 230, and the reference electrode 240, which are electrically connected to the secondary battery 110, may be connected to a three-electrode charger/discharger (not shown). Here, the three-electrode charger/discharger may control the charging and discharging of the jig 200 for measuring a 3-electrode voltage and may measure the charging and discharging voltage.

11

TABLE 1

| Cycle | Actual secondary battery | Secondary battery mounted in jig | Suitability (%) |
|---|---|---|---|
| 1 | 16 min and 31 sec | 16 min and 41 sec | 96.5 |
| 2 | 16 min and 24 sec | 16 min and 42 sec | 93.2 |
| 3 | 16 min and 27 sec | 16 min and 51 sec | 91.1 |
| 4 | 16 min and 25 sec | 16 min and 41 sec | 94.2 |
| 5 | 16 min and 24 sec | 16 min and 42 sec | 93.2 |
| Average | 16 min and 26 sec | 16 min and 43 sec | 93.7 |

The charging time for the secondary battery mounted on the jig 200 for measuring a 3-electrode voltage to reach the same voltage is 93.7% compared to the charging time of the actual secondary battery, which can be seen to be similar to that of an actual secondary battery. That is, the jig 200 for measuring a 3-electrode voltage can measure the charge and discharge characteristics of the secondary battery 110 in situations similar to those of the actual secondary battery.

Figure 7A:
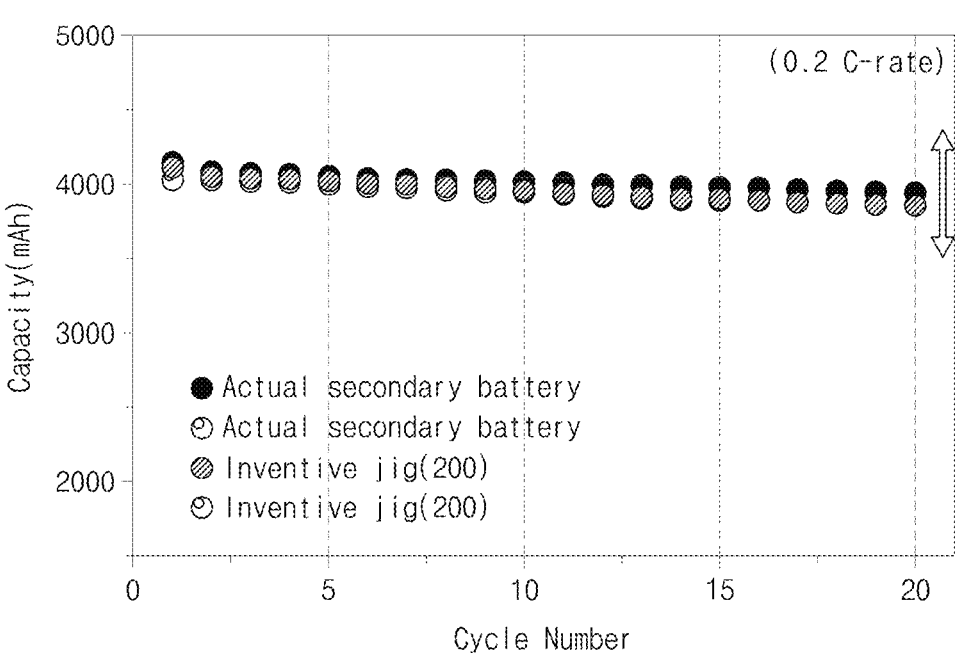
FIGS. 7A and 7B show the comparison results of the efficiency and capacity according to the charging/discharging cycles of an actual secondary battery and a secondary battery mounted on a jig for measuring the 3-electrode voltage.
Figure 7B:
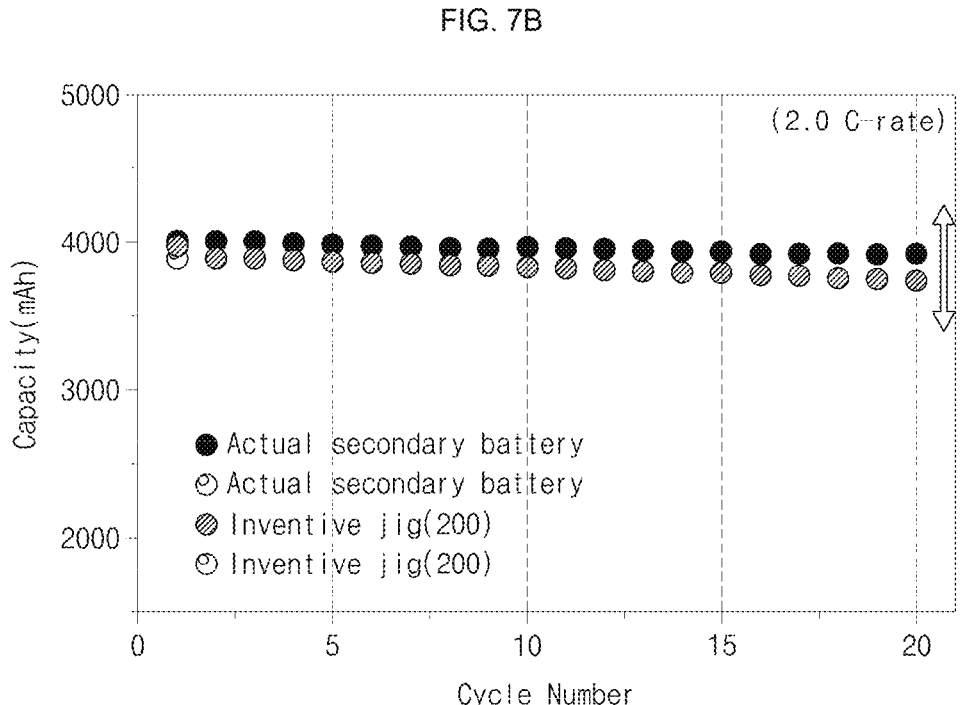

Referring to FIGS. 7A and 7B, when charging and discharging 20 times at a 0.2 C rate, the capacities of the actual secondary battery, and the secondary battery mounted on the jig 200 for measuring a 3-electrode voltage (as shown in FIG. 1) are measured, and the average charging/discharging efficiency, and the result of the capacity retention rate of the secondary battery 110, are shown.

In FIG. 7A, after charging and discharging 20 times, the capacity retention rate of the actual secondary battery 110 is 96.7%, and the capacity retention rate of the secondary battery mounted on the jig 200 for measuring a 3-electrode voltage is 95.4%. That is, as compared with the actually used secondary battery 110, the capacity retention rate of the secondary battery mounted on the jig 200 for measuring a 3-electrode voltage, after charging and discharging 20 times, is 98.6%, and it can be seen that there is no significant difference in characteristics of the secondary battery mounted on the jig 200 and the actual secondary battery. That is, the jig 200 for measuring a 3-electrode voltage may be capable of measuring charging and discharging voltages in a similar manner to that of the actually used secondary battery 110. In addition, it can be seen that the actual secondary battery 110 and the secondary battery 110 mounted on the jig 200 for measuring a 3-electrode voltage are also similar in terms of average charging/discharging efficiency.

In addition, referring to FIG. 7B, when charging and discharging 20 times at 2 C rate, the capacities of the actual secondary battery and the secondary battery mounted on the jig 200 for measuring a 3-electrode voltage (as shown in FIG. 1) are measured, and the average charging/discharging efficiency, and the results of the capacity retention rate of the secondary battery 110, are shown. The capacity retention rate of the actual secondary battery 110 is 97.8%, and the capacity retention rate of the secondary battery mounted on the jig 200 for measuring a 3-electrode voltage may be 96.1%. That is, as compared with the actually used secondary battery 110, the capacity retention rate of the secondary battery mounted on the jig 200 for measuring a 3-electrode voltage, after charging and discharging 20 times, is 95.6%, and it can be seen that there is no significant difference in characteristics between the secondary battery mounted on the jig 200 and the actual secondary battery.

That is, the jig for measuring a 3-electrode voltage of the present disclosure may be capable of measuring charging and discharging voltages of the secondary battery 110 in conditions similar to those of the actually used secondary battery 110 Errors in evaluating an secondary battery can therefore be reduced. In addition, the jig 200 for measuring a 3-electrode voltage of the present disclosure can be mounted after only the cap assembly of the secondary battery 110 is removed, thereby reducing the time required to dismantle the secondary battery Thus, measurement of charging and discharging voltages is facilitated.

As described herein, the jig for measuring a 3-electrode voltage according to an embodiment of the present disclosure can measure charging and discharging voltages of a secondary battery in an environment similar to that of an actually used secondary battery by minimizing air contact and electrolyte use of a battery cell. That is, an embodiment of the present disclosure provides a jig for measuring a 3-electrode voltage that can measure charging and discharging voltages of a secondary battery in an environment similar to that of an actually used secondary battery, and, thus, errors in evaluating a secondary battery can be reduced.

More specifically, after a secondary battery with only a cap assembly removed is mounted in a jig for measuring a 3-electrode voltage, charging and discharging voltages of the secondary battery can be measured. With such a technique, the time required to dismantle the secondary battery is minimal. And the measurement of charging and discharging voltages is enabled with conditions similar to those of an actually used secondary battery, thereby improving the reliability of secondary battery evaluation results.

While the foregoing embodiment is one embodiment for carrying out the jig for measuring a 3-electrode voltage according to the present disclosure, the disclosure herein is not limited to the embodiment. It will be understood by a person skilled in the art that various changes in form and details may be made without departing from the spirit and scope of the present disclosure as defined by the following claims.

What is claimed is:

1. A jig for measuring a 3-electrode voltage, the jig comprising:
   a jig body including (i) a receiving part configured to mount a secondary battery and (ii) a top plate;
   a jig door that opens or closes a side of the jig body at which the receiving part is located;
   a cathode electrode that is mounted on the jig body, with a first part of the cathode electrode being positioned in the receiving part, the first part of the cathode electrode configured to be electrically connected to the secondary battery mounted in the receiving part, and with the cathode electrode having a second part protruding to outside of the jig;
   an anode electrode that is mounted on the jig body, with a first part of the anode electrode being positioned in the receiving part, the first part of the anode electrode configured to be electrically connected to the secondary battery mounted in the receiving part, and with the anode electrode having a second part protruding to outside of the jig; and
   a reference electrode that penetrates the top plate, is configured to be inserted into an electrolyte in a core of the secondary battery mounted in the receiving part, and protrudes upward from the jig body.

2. The jig as recited in claim 1, wherein the reference electrode has a metal cap on one end of a metal wire, the metal cap configured to be inserted into a core of the secondary battery.

3. The jig as recited in claim 2, wherein the top plate of the jig body comprises a reference groove having a depth downward from the top surface, and a reference hole penetrating the top plate downward from a center of the reference groove.

4. The jig as recited in claim 3, further comprising a protection tube interposed between the reference electrode and the jig body, the protection tube including (i) a body part having a diameter corresponding to an inner diameter of the reference groove and (ii) an extension part extending downward from a center of the body part, the extension part having a diameter corresponding to an inner diameter of the reference hole.

5. The jig as recited in claim 4, wherein the protection tube further comprises an O-ring provided on an outer surface of the body part.

6. The jig as recited in claim 4, wherein the protection tube further comprises a penetration tube that extends between the upper and lower portions of the protection tube, the reference electrode extends through the penetration tube, and the reference electrode protrudes upward of and downward from the protection tube.

7. The jig as recited in claim 4, further comprising a hole cover coupled to the top plate of the jig body, the hole cover having a reference hole for exposing a protruding portion of the reference electrode to outside of the jig.

8. The jig as recited in claim 7, wherein the hole cover comprises a reference groove having a length upward from a bottom surface of the hole cover, and a reference hole penetrating the hole cover upward from a center of the reference groove of the hole cover.

9. The jig as recited in claim 8, wherein the body part of the protection tube is interposed between the top plate of the jig body and the hole cover.

10. The jig as recited in claim 1, wherein the jig door has a flat plate shape, one edge of the inner surface of the jig door is coupled to the jig body by a hinge, and the side of the jig body is opened or closed by rotation.

11. The jig as recited in claim 10, wherein the jig door further comprises a receiving part on the inner surface thereof configured to accommodate a portion of the secondary battery mounted in the receiving part of the jig body.

12. The jig as recited in claim 10, wherein a rubber packing is further provided along an edge of the inner surface of the jig door, the rubber packing being interposed between the inner surface of the jig door and the side of the jig body.

13. The jig as recited in claim 10, wherein a spring press is provided on the inner surface of the jig door, the spring press being configured to contact the secondary battery.

14. The jig as recited in claim 1, wherein the jig body has a rectangular parallelepiped shape.

15. The jig as recited in claim 1, wherein an inner surface of the receiving part is configured such that a conductive member of the second battery extends to partially cover the side of the jig body.

16. The jig as recited in claim 1, wherein the cathode electrode is mounted on an upper part of the side.

17. The combination of a jig according to claim 1 and a secondary battery positioned in the receiving part of the jig.

18. A jig for measuring a 3-electrode voltage of a secondary battery, the jig comprising:
   a jig body including (i) a receiving part configured to receive the secondary battery and (ii) a top plate;
   a jig door that opens or closes a side of the jig body at which the receiving part is located;
   a cathode electrode that is mounted to the jig body, with a first part of the cathode electrode being positioned in the receiving part, and with a second part of the cathode electrode protruding to outside of the jig;
   an anode electrode that is mounted to the jig body, with a first part of the anode electrode being positioned in the receiving part, and with a second part of the anode electrode protruding to outside of the jig; and
   a reference electrode that penetrates the top plate of the jig body and protrudes upward from the jig body.

* * * * *